US012677703B2

(12) United States Patent
Chen et al.

(10) Patent No.: US 12,677,703 B2
(45) Date of Patent: Jul. 7, 2026

(54) THREE-DIMENSIONAL FAN-OUT MEMORY PACKAGE WITH CONDUCTIVE PILLARS AND PACKAGING METHOD THEREOF

(71) Applicant: SJ Semiconductor(Jiangyin) Corporation, Jiangyin City (CN)

(72) Inventors: Yenheng Chen, Jiangyin City (CN); Chengchung Lin, Jiangyin City (CN)

(73) Assignee: SJ Semiconductor (Jiangyin) Corporation, Jiangyin City (CN)

( * ) Notice: Subject to any disclaimer, the term of this patent is extended or adjusted under 35 U.S.C. 154(b) by 534 days.

(21) Appl. No.: 18/139,744

(22) Filed: Apr. 26, 2023

(65) Prior Publication Data

US 2023/0352461 A1    Nov. 2, 2023

(30) Foreign Application Priority Data

Apr. 29, 2022    (CN) .......................... 202210475750.9

(51) Int. Cl.
*H01L 23/498* (2006.01)
*H01L 21/66* (2006.01)
(Continued)

(52) U.S. Cl.
CPC ............ *H10W 90/00* (2026.01); *H10B 80/00* (2023.02); *H10W 70/093* (2026.01);
(Continued)

(58) Field of Classification Search
CPC . H01L 25/50; H01L 25/0657; H01L 25/0652; H01L 25/071; H01L 25/074;
(Continued)

(56) References Cited

U.S. PATENT DOCUMENTS 11,158,608 B2 * 10/2021 Shen ........................ H10P 72/74
2009/0001599 A1 * 1/2009 Foong ................ H01L 25/0657
257/E23.024

(Continued)

FOREIGN PATENT DOCUMENTS

CN    110828431 A  *  2/2020  ......... H01L 23/3135
CN    111009502 B  *  7/2021  ............. H01L 23/49

*Primary Examiner* — Wael M Fahmy
*Assistant Examiner* — Aneesa Riaz Baig
(74) *Attorney, Agent, or Firm* — IPRTOP LLC

(57) ABSTRACT

A three-dimensional fan-out memory package structure and a packaging method are disclosed. The package structure includes a three-dimensional fan-out memory package unit, which includes: a memory chip stack having at least two memory chips laminated in a stepped configuration, each memory chip is provided with a bonding pad; first metal connection pillars formed on the bonding pads; second metal connection pillars; a first encapsulating layer; a first rewiring layer formed on a back side of the memory chip stack; a second rewiring layer formed over a front side of the memory chip stack; and metal bumps. The package structure further includes: at least one peripheral circuit chip electrically connected with the first rewiring layer; and a second encapsulating layer, which encapsulates the peripheral circuit chip. The package structure allows for high-density and high-integration of line width/line spacing. The process time can be shortened, and the efficiency is high.

9 Claims, 2 Drawing Sheets

(51) Int. Cl.

| | |
|---|---|
| *H01L 23/00* | (2006.01) |
| *H10B 80/00* | (2026.01) |
| *H10D 12/00* | (2025.01) |
| *H10D 62/10* | (2025.01) |
| *H10D 62/13* | (2025.01) |
| *H10D 64/27* | (2025.01) |
| *H10W 70/05* | (2026.01) |
| *H10W 70/60* | (2026.01) |
| *H10W 70/65* | (2026.01) |
| *H10W 72/00* | (2026.01) |
| *H10W 72/20* | (2026.01) |
| *H10W 74/01* | (2026.01) |
| *H10W 74/10* | (2026.01) |
| *H10W 74/15* | (2026.01) |
| *H10W 90/00* | (2026.01) |
| *H10W 90/24* | (2026.01) |

(52) U.S. Cl.
CPC ......... *H10W 70/65* (2026.01); *H10W 74/016* (2026.01); *H10W 74/117* (2026.01); *H10W 90/24* (2026.01); *H10W 90/401* (2026.01); *H10W 90/701* (2026.01); *H10W 70/60* (2026.01); *H10W 72/07252* (2026.01); *H10W 72/07253* (2026.01); *H10W 72/221* (2026.01); *H10W 72/234* (2026.01); *H10W 72/877* (2026.01); *H10W 74/15* (2026.01); *H10W 90/722* (2026.01); *H10W 90/724* (2026.01); *H10W 90/732* (2026.01); *H10W 90/734* (2026.01)

(58) Field of Classification Search
CPC .................. H01L 25/117; H01L 25/18; H01L 2224/32145; H01L 21/4853; H01L 23/3107; H01L 23/3128; H01L 23/481; H01L 23/485; H01L 2225/0652; H01L 2225/06548; H01L 2225/06562; H01L 2225/1058; H01L 21/56–566; H01L 2924/181; H01L 2924/18162; H10W 90/20; H10W 90/26; H10W 90/275; H10W 90/401; H10W 70/60; H10W 70/611; H10W 70/614; H10W 90/24; H10W 90/724; H10W 90/734; H10W 74/01; H10W 74/012; H10W 74/111; H10W 74/117; H10W 74/016; H10W 74/40; H10W 74/724; H10W 74/734; H10B 80/00
See application file for complete search history.

(56) References Cited

U.S. PATENT DOCUMENTS

| | | | | |
|---|---|---|---|---|
| 2017/0186737 A1* | 6/2017 | Fang | ........................ | H01L 24/09 |
| 2019/0067248 A1* | 2/2019 | Yoo | ........................ | H10W 90/00 |
| 2019/0333879 A1* | 10/2019 | Chen | ..................... | H01Q 21/065 |
| 2020/0126924 A1* | 4/2020 | Lee | ........................ | H01L 24/20 |
| 2021/0091043 A1* | 3/2021 | Shen | ........................ | H10P 72/74 |
| 2021/0210476 A1* | 7/2021 | Kang | ..................... | H01L 25/18 |
| 2022/0013477 A1* | 1/2022 | Homma | ............. | H10W 42/121 |
| 2023/0082706 A1* | 3/2023 | Ganesan | ................. | H01L 24/18 257/734 |
| 2023/0197552 A1* | 6/2023 | Sikka | .................... | H10W 40/22 257/668 |
| 2023/0209842 A1* | 6/2023 | Zeng | ..................... | H10B 80/00 257/690 |
| 2023/0307419 A1* | 9/2023 | Homma | ................ | H10W 90/00 |
| 2023/0420429 A1* | 12/2023 | Chang | ................. | H01L 21/6835 |

* cited by examiner

THREE-DIMENSIONAL FAN-OUT MEMORY PACKAGE WITH CONDUCTIVE PILLARS AND PACKAGING METHOD THEREOF

CROSS REFERENCE TO RELATED APPLICATION

The present application claims the benefit of priority to Chinese Patent Application No. CN 202210475750.9, entitled "THREE-DIMENSIONAL FAN-OUT MEMORY PACKAGE STRUCTURE AND PACKAGING METHOD THEREOF", filed with CNIPA on Apr. 29, 2022, the disclosure of which is incorporated herein by reference in its entirety.

FIELD OF TECHNOLOGY

The present disclosure relates to the technical field of semiconductor packaging, and in particular, to a three-dimensional fan-out memory package structure and a packaging method thereof.

BACKGROUND

In traditional substrate manufacturing, the printed circuit boards (PCBs) support electronic components, and also serve as carriers for electrical connection of electronic components. The more chip I/Os are on the substrates, the more substrate layers will be needed, and the higher the overall cost will result in. The production process also has certain limits. Currently, the line width/line spacing has a minimum set at 20 $\mu$m/20 $\mu$m, more frequently 50 $\mu$m/50 $\mu$m applies. And with the rapid development of integrated circuit manufacturing technology, the front-end process of integrated circuits has chased the limits of Moore's Law, and reaching the physical limit of lithography exposure of the process. As the front-end chip manufacturing is capable at an increasingly higher integration level in functions, the current substrate technology will no longer be able to support the integrating requirements of the front-end chip manufacturing. Therefore, various advanced packaging techniques have been developed, such as the 2.5D & fan-out wafer level advanced packaging technology, ball grid array packaging (BGA) technology, chip size packaging (CSP) technology, wafer level packaging (WLP) technology, and the like. However, these technologies are more expensive and take longer to manufacture than substrate manufacturing techniques.

SUMMARY

The present disclosure provides a three-dimensional fan-out memory package structure, including: a three-dimensional fan-out memory package unit, which includes: a memory chip stack having at least two memory chips laminated in a stepped configuration, each of the at least two memory chip being provided with a bonding pad arranged on one of step surfaces of the stepped configuration; first metal connection pillars, each of the first metal connection pillars having a first end and a second end, the first end being formed on and electrically connected to one of the bonding pads; second metal connection pillars, each of the second metal connection pillars having a first end and a second end, and the second metal connection pillars being formed outside the memory chip stack; a first encapsulating layer, the first encapsulating layer encapsulating the at least two memory chips, the first metal connection pillars, and the second metal connection pillars, the second end of each of the first metal connection pillars and the second end of each of the second metal connection pillars being exposed from the first encapsulating layer; a first rewiring layer having a first surface and a second surface, the first surface of the first rewiring layer being formed on a back side of the memory chip stack and connected to the first end of each of the second metal connection pillars; a second rewiring layer having a first surface and a second surface, the second surface of the second rewiring layer being formed over a front side of the memory chip stack, and the second surface of the second rewiring layer being connected to the second end of each of the first metal connection pillars and the second end of each of the second metal connection pillars; and metal bumps, formed on the first surface of the second rewiring layer.

The three-dimensional fan-out memory package structure further includes: at least one peripheral circuit chip arranged in two dimensions, a back side of the at least one peripheral circuit chip being electrically connected with the second surface of the first rewiring layer; and a second encapsulating layer, which encapsulates the at least one peripheral circuit chip.

The present disclosure further provides a method of packaging a three-dimensional fan-out memory package structure, including: providing a three-dimensional fan-out memory package unit, which includes: forming a memory chip stack having at least two memory chips laminated in a stepped configuration, forming a bonding pad on one of step surfaces of the stepped configuration for each of the at least two memory chips; forming first metal connection pillars, each of the first metal connection pillars having a first end and a second end, said first end being formed on and electrically connected to the bonding pad; forming second metal connection pillars, each of the second metal connection pillars having a first end and a second end and being formed outside the memory chip stack; forming a first encapsulating layer, the first encapsulating layer encapsulating the at least two memory chips, the first metal connection pillars, and the second metal connection pillars, the second end of each of the first metal connection pillars and the second end of each of the second metal connection pillars being exposed from the first encapsulating layer; forming a first rewiring layer having a first surface and a second surface, the first surface of the first rewiring layer being formed on a back side of the memory chip stack and connected to the first end of each of the second metal connection pillars; forming a second rewiring layer having a first surface and a second surface, the second surface of the second rewiring layer being formed over a front side of the memory chip stack, and the second surface of the second rewiring layer being connected to a second end of each of the first metal connection pillars and the second end of each of the second metal connection pillars; and forming metal bumps.

The method of packaging a three-dimensional fan-out memory package structure further includes: providing at least one peripheral circuit chip arranged in two dimensions, the at least one peripheral circuit chip being electrically connected with the second surface of the first rewiring layer; and encapsulating the at least one peripheral circuit chip with a second encapsulating layer.

As mentioned above, the three-dimensional fan-out memory package structure and the packaging method thereof provided by the present disclosure adopts a fan-out pattern and realizes the three-dimensional package of the three-dimensional fan-out memory package unit and the peripheral circuit chip by rewiring layers, and in addition, realizes the transmission and lead-out of signals between the memory chip and the peripheral circuit chip through first and second metal connection pillars. Through-silicon-via (TSV) holes are not required in the entire package structure for any circuit lead-out, which effectively reduces packaging costs. This eliminates the circuit substrate required for traditional electronic component packaging, enables high-density and high-integration device packaging, and achieves the minimum line width/line spacing reduction to 1.5 μm/1.5 μm. As a result, the process time will be shortened, and efficiency will be increased. Further, the overall thickness dimension of the package structure will be significantly reduced. Finally, this POP structure makes it possible to realize a one-stop packaging process in which a substrate is used to support the back-end-of-line (BEOL) instead of the middle-end-of-line (MEOL).

DESCRIPTION OF REFERENCE NUMERALS

Figure 1:
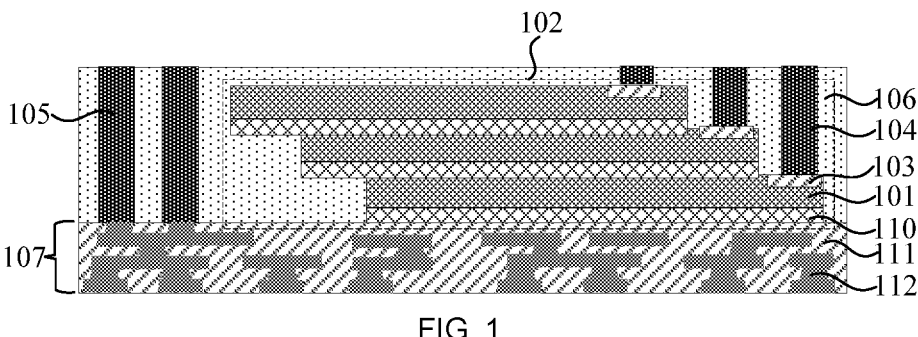
FIG. 1 shows a schematic diagram of a package unit for a three-dimensional fan-out memory package structure according to the present disclosure.

10 Three-dimensional fan-out memory package unit
101 Memory chip
102 Memory chip stack
103 Bonding pad
104 First metal connection pillar
105 Second metal connection pillar
106 First encapsulating layer
107 First rewiring layer
108 Second rewiring layer
109 Metal bumps
110 Bonding layer
111 Dielectric layer
112 Metal wiring layer
201 Peripheral circuit chip
202 Second encapsulating layer
203 Bottom filler layer

DETAILED DESCRIPTION

The embodiments of the present disclosure will be described below. Those skilled in the art can easily understand other advantages and effects of the present disclosure according to contents disclosed by the specification. The present disclosure may also be implemented or applied through other different specific implementation modes. Various modifications or changes may be made to all details in the specification based on different points of view and applications without departing from the spirit of the present disclosure.

Please refer to FIGS. 1-4. It needs to be stated that the drawings provided in the following embodiments are just used for schematically describing the basic concept of the present disclosure, thus only illustrating components only related to the present disclosure and are not drawn according to the numbers, shapes and sizes of components during actual implementation, the configuration, number and scale of each component during actual implementation thereof may be changed according to actual needs, and the component layout configuration thereof may be more complicated.

Embodiment 1

FIGS. 1-4 show structures forming a package structure for a three-dimensional fan-out memory device. The package structure includes a three-dimensional fan-out memory package unit 10, at least one peripheral circuit chip 201, and a second encapsulating layer 202.

Figure 2:
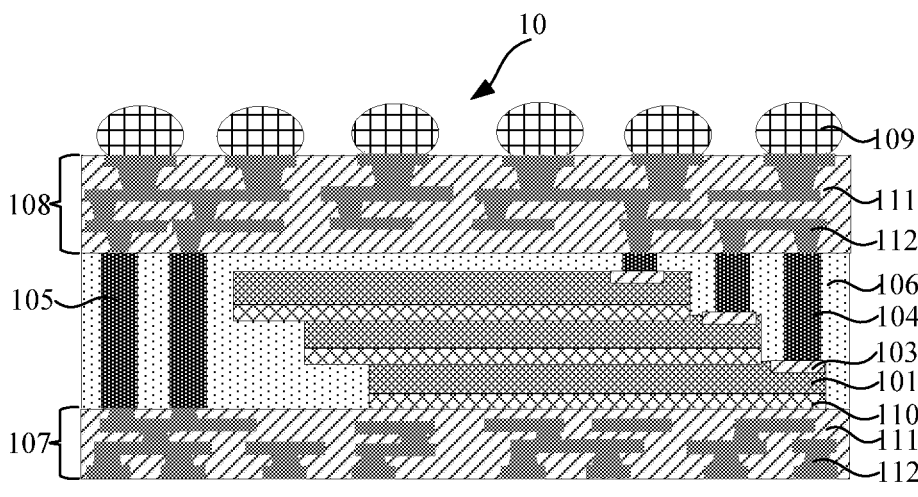
FIG. 2 shows a schematic diagram of a package unit for a three-dimensional fan-out memory package structure according to the present disclosure.

As shown in FIGS. 1-2, the three-dimensional fan-out memory package unit 10 includes: a memory chip stack 102 having at least two memory chips 101 laminated in a stepped configuration, each memory chip 101 is provided with a bonding pad 103 arranged on a step surface of the stepped configuration; first metal connection pillars 104, each first metal connection pillar 104 has a first end formed on and electrically connected to the bonding pad 103; second metal connection pillars 105, each second metal connection pillar 105 has a first end and a second end and is formed on the outside of the memory chip stack 102; a first encapsulating layer 106, which encapsulates the memory chips 101, the first metal connection pillars 104, and the second metal connection pillars 105, and the first encapsulating layer 106 exposes a second end of each first metal connection pillar 104 and both ends of each second metal connection pillar 105; a first rewiring layer 107 having a first surface and a second surface, the first surface of the first rewiring layer 107 is formed on a back side of the memory chip stack 102 and connected to the first end of each second metal connection pillar 105; a second rewiring layer 108 having a first surface and a second surface, the second surface of the second rewiring layer 108 is formed on a front side of the memory chip stack 102, and the second surface of the second rewiring layer 108 is electrically connected to the second end of each first metal connection pillar 104 and the second end of each second metal connection pillar 105; and metal bumps 109, formed on the first surface of the second rewiring layer 108.

Figure 3:
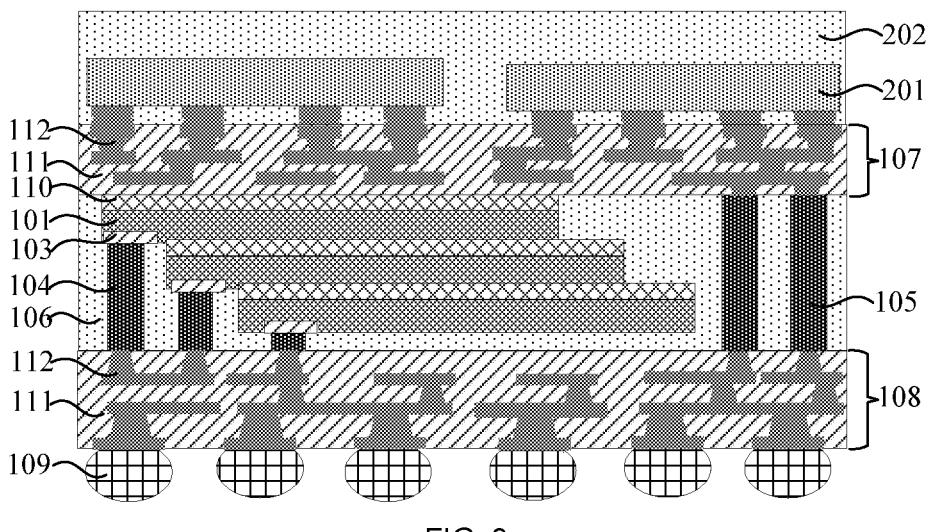
FIG. 3 shows a schematic diagram of a three-dimensional fan-out memory package structure according to the present disclosure.
Figure 4:
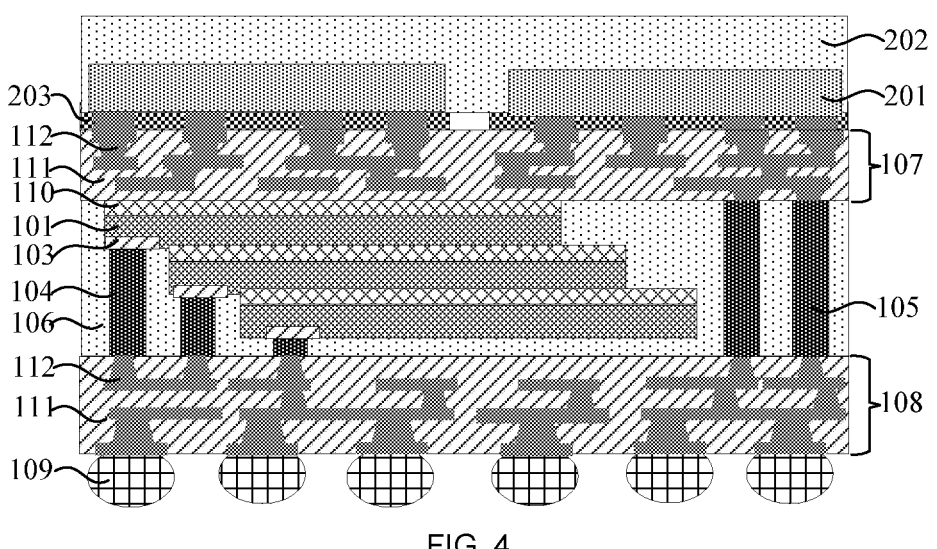
FIG. 4 shows a schematic diagram of another three-dimensional fan-out memory package structure according to the present disclosure.

As shown in FIGS. 3-4, the at least one peripheral circuit chip 201 is arranged in two dimensions and electrically connected with the second surface of the first rewiring layer 107.

The second encapsulating layer 202 encapsulates the peripheral circuit chip 201.

The three-dimensional fan-out memory package structure provided in this Embodiment adopts a fan-out pattern and realizes the three-dimensional package of the three-dimensional fan-out memory package unit and the peripheral circuit chip by rewiring layers, and in addition it realizes the transmission and lead-out of signals between the memory chips and the peripheral circuit chip(s) through first and second metal connection pillars. TSV holes will not be required in the entire package structure for any circuit lead-out, which effectively reduces packaging costs. This embodiment also eliminates the circuit substrate required for traditional electronic component packaging, enables high-density and high-integration device packaging, and achieves the minimum line width/line spacing reduction to 1.5 μm/1.5 μm. As a result, the process time will be shortened, and efficiency will be increased. Further, the overall thickness dimension of the package structure will be significantly reduced. Finally, this POP structure makes it possible to realize a one-stop packaging process in which a substrate is used to support the back-end-of-line (BEOL) instead of the middle-end-of-line (MEOL).

As shown in FIG. 4, as an example, space under the bottom of the peripheral circuit chip 201 is filled with a bottom filler layer 203. In detail, the bottom filler layer 203 is provided between the peripheral circuit chip 201 and the second surface of the first rewiring layer 107. The bottom filler layer 203 can improve the bonding strength between the peripheral circuit chip 201 and the first rewiring layer 107 and protect the first rewiring layer 107. Based on this fabrication, the material of the bottom filler layer 203 may have smaller particles compared with those in the encapsulating layer, so that the bottom filler layer 203 has strong bonding strength and can effectively protect the first rewiring layer 107.

As shown in FIGS. 1-2, in the memory chip stack 102, the memory chips 101 are laminated by means of bonding layers 110. Further, the bonding between the memory chip stack 102 and the first rewiring layer 107 is also realized by means of a bonding layer 110. Specifically, the bonding between two adjacent memory chips 101 is achieved by means of a bonding layer 110, and the bonding between the bottommost memory chip 101 and the first rewiring layer 107 is also achieved by means of a bonding layer 110.

The memory chip 101 can be any memory chip suitable for three-dimensional lamination, such as DRAM, SRAM, flash memory, EEPROM, PRAM, MRAM and RPAM. In addition, the functions of the memory chips 101 in each layer of the laminated memory chips in the stepped configuration may be the same or different, the sizes of the memory chips 101 in each layer may be the same or different, and the sizes of the step surface of the memory chips 101 in each layer can be the same or different. The above parameters may be set according to the specific requirements of the package structure. The peripheral circuit chip 201 is mainly used to drive and control the memory chip 101. The peripheral circuit chip 201 may include peripheral circuit transistors and peripheral logic circuits. The peripheral logic circuits may include, but are not limited to, static random access memory (SRAM), phase locked loop (PLL), central processing unit (CPU), field programmable gate array (FPGA), etc. The design of the peripheral logic circuits depends on the different chips and functions.

As shown in FIG. 2, the first metal connection pillar 104 serves as an electrical connection conduit between the bonding pad 103 and the second rewiring layer 108, to lead out the signal of the memory chip 101; the second metal connection pillar 105 serves as an electrical connection conduit between the first rewiring layer 107 and the second rewiring layer 108, to lead out the signal of the peripheral circuit chip 201, and to allow the transfer and leadout of signals between the peripheral circuit chip 201 and the memory chip 101. The materials of the first metal connection pillar 104 and the second metal connection pillar 105 may have good conductivity and do not cause outward diffusion. For example, the material of the first metal connection pillar 104 is selected from gold, silver, aluminum, and copper, and the material of the second metal connection pillar 105 is selected from gold, silver, aluminum, and copper. However, the material of the first metal connection pillar 104 and the second metal connection pillar 105 is not limited to the above-mentioned, other materials having good conductivity are also applicable.

As shown in FIGS. 1 and 2, the material of the bonding pad 103 on each memory chip 101 includes metallic aluminum, i.e., the bonding pad 103 is an aluminum bonding pad. When preparing the bonding pad 103, an adhesive layer may be formed under the bonding pad 103, and an anti-reflection layer may be formed on the bonding pad 103, in order to improve electrical properties of the bonding pad and enhance the bonding between the bonding pad 103 and the memory chip 101.

As shown in FIG. 4, as an example, the material of the first encapsulating layer 106 includes one of polyimide, silicone, and epoxy resin; similarly, the material of the second encapsulating layer 202 includes one of polyimide, silicone, and epoxy resin. Top surfaces of the first encapsulating layer 106 and the second encapsulating layer 202 are both ground or polished flat surfaces, to improve the quality of the subsequently formed rewiring layers and the quality of the package body.

As shown in FIG. 2, as an example, the first rewiring layer 107 and the second rewiring layer 108 each includes a dielectric layer 111 and a metal wiring layer 112. The material of the dielectric layer 111 includes one or a combination of two or more of epoxy resin, silicone rubber, polyimide (PI), polybenzoxazole (PBO), benzocyclobutene (BCB), silicon oxide, phosphorosilicate glass, and fluorine-containing glass. The material of the metal wiring layer 112 includes one or a combination of two or more of copper, aluminum, nickel, gold, silver, and titanium. It should be noted here that although the first rewiring layer 107 and the second rewiring layer 108 each includes a dielectric layer 111 and a metal wiring layer 112, the material, number of layers and distribution shape of the rewiring layers at different locations will be set according to actual needs and are not limited herein.

As shown in FIG. 2, as an example, one of the metal bumps 109 includes a connecting structure, which includes a solder ball, or a metal pillar and a solder ball formed on the metal pillar. Preferably, the solder ball includes one of a gold-tin solder ball, a silver-tin solder ball, and a copper-tin solder ball. Preferably, the metal pillar is a copper pillar or a nickel pillar. In this embodiment, the metal bumps 109 are in the form of gold-tin solder balls, the manufacturing steps of which include: first forming a gold-tin layer, then using a high-temperature reflow process to reflow the gold-tin layer into a ball, and then forming a gold-tin solder ball after cooling down; or using a bumping process to form a gold-tin solder ball.

Embodiment 2

This embodiment provides a method of packaging a three-dimensional fan-out memory package structure. The three-dimensional fan-out memory package structure of Embodiment 1 may be prepared using the packaging method of this embodiment. However, the three-dimensional fan-out memory package structure of Embodiment 1 can also be prepared using other packaging methods.

Specifically, FIGS. 1-4 show schematic diagrams of the structures presented in each step of the packaging method of the three-dimensional fan-out memory package structure according to this embodiment.

As shown in FIGS. 1-2, step S1 is first performed to provide a three-dimensional fan-out memory package unit 10, which includes: a memory chip stack 102 having at least two memory chips 101 laminated in a stepped configuration, each memory chip 101 is provided with a bonding pad 103 arranged on a step surface of the stepped configuration; first metal connection pillars 104, each first metal connection pillar 104 has a first end formed on and electrically connected to the bonding pad 103; second metal connection pillars 105, each second metal connection pillar 105 has a first end and a second end and is formed on the outside of the memory chip stack 102; a first encapsulating layer 106, which encapsulates the memory chips 101, the first metal connection pillars 104, and the second metal connection pillars 105, and the first encapsulating layer 106 exposes a second end of each first metal connection pillar 104 and both ends of each second metal connection pillar 105; a first rewiring layer 107 having a first surface and a second surface, the first surface of the first rewiring layer 107 is formed on a back side of the memory chip stack 102 and is connected to the first end of each second metal connection pillar 105; a second rewiring layer 108 having a first surface and a second surface, the second surface of the second rewiring layer 108 is formed on a front side of the memory chip stack 102, and the second surface of the second rewiring layer 108 is electrically connected to the second end of each first metal connection pillar 104 and the second end of each second metal connection pillar 105; and metal bumps 109, formed on the first surface of the second rewiring layer 108.

As shown in FIGS. 1-2, as a specific example, the method of forming the three-dimensional fan-out memory package unit 10 includes steps S11-S15.

S11, as shown in FIG. 1, includes forming the first rewiring layer 107 having a first surface and a second surface.

As a specific example, the forming of the first rewiring layer 107 may include the following steps: first forming a dielectric layer using a chemical vapor deposition process or a physical vapor deposition process, and etching the dielectric layer to form a patterned dielectric layer 111; then forming a metal wiring layer on a surface of the patterned dielectric layer 111 using a chemical vapor deposition process, a physical vapor deposition process, a sputtering process, an electroplating process, or a chemical plating process, and etching the metal wiring layer to form a patterned metal wiring layer 112. It should be noted here that the material, number of layers and distribution shape of the dielectric layer 111 and the metal wiring layer 112 can be set according to the specific conditions of different memory chips and will not be limited here.

S12, as shown in FIG. 1, includes forming the memory chip stack 102, the first metal connection pillars 104, and the second metal connection pillars 105 on the first surface of the first rewiring layer 107.

It should be noted here that the order of forming the memory chip stack 102, the first metal connection pillars 104 and the second metal connection pillars 105 may be adjusted according to specific situations. For example, the memory chip stack 102 and the first metal connection pillars 104 can be prepared first, and then the second metal connection pillars 105; or the second metal connection pillars 105 can be prepared first, and then the memory chip stack 102 and the first metal connection pillars 104 can be prepared.

As an example, the memory chip stack 102 may be formed using a surface mount process. Specifically, the bonding between two adjacent memory chips 101 is achieved by means of a bonding layer 110, and the bonding between the bottommost memory chip 101 and the first rewiring layer 107 is also achieved by means of a bonding layer 110.

As an example, the first metal connection pillars 104 and the second metal connection pillars 105 may be formed by electroplating or chemical plating.

S13, as shown in FIG. 1, includes encapsulating the memory chip stack 102, the first metal connection pillars 104 and the second metal connection pillars 105 by the first encapsulating layer 106. The first encapsulating layer 106 exposes one end of each first metal connection pillar 104 and both ends of each second metal connection pillar 105.

As an example, the first encapsulating layer 106 may be formed by the method of compression molding, transfer molding, hydraulic molding, vacuum lamination or spin coating. Preferably, after forming the first encapsulating layer 106, a process of grinding or polishing may also be applied to the upper surface of the first encapsulating layer 106, to provide a first encapsulating layer 106 with a flat surface and to improve product quality.

S14, as shown in FIG. 2, includes forming the second rewiring layer 108 on the first encapsulating layer 106. The second rewiring layer 108 has a first surface and a second surface, the second surface of the second rewiring layer 108 is connected to the first metal connection pillars 104 and the second metal connection pillars 105. The method of forming the second rewiring layer 108 can be referred to the method of forming the first rewiring layer 107 above and will not be repeated herein. However, the method of forming the second rewiring layer 108 is not limited herein, other methods of preparing rewiring layer are also applicable.

S15, as shown in FIG. 2, includes forming the metal bumps 109 on the first surface of the second rewiring layer 108.

As an example, one of the metal bumps 109 includes a connecting structure, which includes a solder ball, or a metal pillar and a solder ball formed on the metal pillar. Preferably, the solder ball includes one of a gold-tin solder ball, a silver-tin solder ball, and a copper-tin solder ball. Preferably, the metal pillar is a copper pillar or a nickel pillar. In this embodiment, the metal bumps 109 are gold-tin solder balls, the manufacturing steps of which include: first forming a gold-tin layer on the surface of the second rewiring layer 108, then using a high-temperature reflow process to reflow the gold-tin layer into a ball, and then forming a gold-tin solder ball after cooling down; or using a bumping process to form a gold-tin solder ball.

As shown in FIGS. 3-4, step S2 is then performed to provide at least one peripheral circuit chip 201 in a two-dimensional arrangement, and electrically connect the peripheral circuit chip 201 to the second surface of the first rewiring layer 107.

The peripheral circuit chip 201 is mainly used to drive and control the memory chip 101. The peripheral circuit chip 201 may include peripheral circuit transistors and peripheral logic circuits. The peripheral logic circuits may include, but are not limited to, static random access memory (SRAM), phase locked loop (PLL), central processing unit (CPU), field programmable gate array (FPGA), etc. The design of the peripheral logic circuits depends on the different chips and functions.

As an example, the peripheral circuit chip 201 is bonded to the second surface of the first rewiring layer 107 using a bonding process.

As shown in FIG. 3, the final step S3 is performed to encapsulate the peripheral circuit chip 201 using the second encapsulating layer 202.

As an example, the second encapsulating layer 202 may be formed by the method of compression molding, transfer molding, hydraulic molding, vacuum lamination or spin coating. Preferably, after forming the second encapsulating layer 202, a process of grinding or polishing may also be applied to the upper surface of the second encapsulating layer 202, to provide a second encapsulating layer 202 with a flat surface and to improve product quality.

As shown in FIG. 4, as an example, before the step of encapsulating the peripheral circuit chip 201 using the second encapsulating layer 202, the method further includes a step of forming a bottom filler layer 203 between the peripheral circuit chip 201 and the second surface of the first rewiring layer 107. The bottom filler layer 203 can improve the bonding strength between the peripheral circuit chip 201 and the first rewiring layer 107 and protect the first rewiring layer 107. Based on this, the material of the bottom filler layer 203 may have smaller particles compared with those in the encapsulating layer, so that the bottom filler layer 203 has strong bonding strength and can effectively protect the first rewiring layer 107.

Based on the above, the three-dimensional fan-out memory package structure and the packaging method thereof provided by the present disclosure adopts a fan-out pattern and realizes the three-dimensional package of the three-dimensional fan-out memory package unit and the peripheral circuit chip by rewiring layers, and in addition realizes the transmission and lead-out of signals between the memory chip and the peripheral circuit chip through first and second metal connection pillars. TSV holes are not required in the entire package structure for any circuit lead-out, which effectively reduces packaging costs. This eliminates the circuit substrate required for traditional electronic component packaging, enables high-density and high-integration device packaging, and achieves the minimum line width/line spacing reduction to 1.5 μm/1.5 μm. As a result, the process time will be shortened, and efficiency will be increased. Further, the overall thickness dimension of the package structure will be significantly reduced. Finally, this POP structure makes it possible to realize a one-stop packaging process in which a substrate is used to support the back-end-of-line (BEOL) instead of the middle-end-of-line (MEOL). Therefore, the present disclosure effectively overcomes various shortcomings in the existing technology and has high industrial utilization value.

The above-mentioned embodiments are merely illustrative of the principle and effects of the present disclosure instead of limiting the present disclosure. Modifications or variations of the above-described embodiments may be made by those skilled in the art without departing from the spirit and scope of the disclosure. Therefore, all equivalent modifications or changes made by those who have common knowledge in the art without departing from the spirit and technical concept disclosed by the present disclosure shall be still covered by the claims of the present disclosure.

What is claimed is:

1. A three-dimensional fan-out memory package structure, comprising:
   a three-dimensional fan-out memory package unit, comprising:
      a first memory chip and a second memory chip laminated in a stepped configuration, wherein the first memory chip and a first bonding layer under the first memory chip are stacked on a bottom of the stepped configuration, and the second memory chip and a second bonding layer under the second memory chip are stacked on a second step of the stepped configuration wherein the second step is arranged to be above and stepped out from the bottom step of the stepped configuration; wherein a first bonding pad is arranged on a surface of the first memory chip and a second bonding pad is arranged on a surface of the second memory chip on the stepped configuration;

a first rewiring layer having a first surface and a second surface, wherein the first surface of the first rewiring layer is bonded to the first bonding layer of the bottom step of the stepped configuration,
   first metal connection pillars, wherein each of the first metal connection pillars has a first end and a second end, wherein the first end is formed on and electrically connected to one of the first and the second bonding pads;
   second metal connection pillars, wherein the second metal connection pillars are formed outside the stepped configuration containing the first and second memory chips, and wherein each of the second metal connection pillars has a first end and a second end, each of the first ends is bonded to the first surface of the first rewiring layer;
   a first encapsulating layer, wherein the first encapsulating layer encapsulates the first and the second memory chips in the stepped configuration, the first metal connection pillars, and the second metal connection pillars, wherein the second end of each of the first metal connection pillars and the second end of each of the second metal connection pillars are exposed from the first encapsulating layer;
   a second rewiring layer having a first surface and a second surface, wherein the second surface of the second rewiring layer is formed over a top side of the stepped configuration, and and connected to the second end of each of the first metal connection pillars and the second end of each of the second metal connection pillars; and
   metal bumps, formed on the first surface of the second rewiring layer;
   at least one peripheral circuit chip arranged in two dimensions, wherein a back side of the at least one peripheral circuit chip is electrically connected with the second surface of the first rewiring layer, and
   a second encapsulating layer, wherein the second encapsulating layer encapsulates the at least one peripheral circuit chip.

2. The three-dimensional fan-out memory package structure according to claim 1, wherein a bottom filler layer is provided between the back side of the at least one peripheral circuit chip and the second surface of the first rewiring layer.

3. The three-dimensional fan-out memory package structure according to claim 1, wherein in the memory chip stack, the first and second memory chips are laminated by the second bonding layer to stick together.

4. The three-dimensional fan-out memory package structure according to claim 1, wherein a material of the first metal connection pillars comprises at least one of gold, silver, aluminum, and copper, and wherein a material of the second metal connection pillars comprises at least one of gold, silver, aluminum, and copper.

5. The three-dimensional fan-out memory package structure according to claim 1, wherein a material of the bonding pad comprises metallic aluminum, a material of the first encapsulating layer comprises one of polyimide, silicone, and epoxy resin, and a material of the second encapsulating layer comprises one of polyimide, silicone, and epoxy resin.

6. The three-dimensional fan-out memory package structure according to claim 1, wherein each of the first rewiring layer and the second rewiring layer comprises a dielectric layer and a metal wiring layer, wherein a material of the dielectric layer of the first rewiring layer and the second rewiring layer comprises one or a combination of two or more of epoxy resin, silicone, polyimide (PI), polybenzoxazole (PBO), benzocyclobutene (BCB), silicon oxide, phosphorosilicate glass, and fluorine-containing glass, and a material of the metal wiring layer comprises one or a combination of two or more of copper, aluminum, nickel, gold, silver, and titanium.

7. The three-dimensional fan-out memory package structure according to claim 1, wherein one of the metal bumps comprises a connecting structure, which includes a solder ball, or a metal pillar and a solder ball formed on the metal pillar, wherein the solder ball comprises one of a gold-tin solder ball, a silver-tin solder ball, and a copper-tin solder ball.

8. A method of packaging a three-dimensional fan-out memory package structure, comprising:

providing a three-dimensional fan-out memory package unit, comprising:

forming a first memory chip and a second memory chip laminated in a stepped configuration, wherein the first memory chip and a first bonding layer under the first memory chip are stacked on a bottom of the stepped configuration, and the second memory chip and a second bonding layer under the second memory chip are stacked on a second step of the stepped configuration, wherein the second step is arranged to be above and stepped out from the bottom step of the stepped configuration;

forming a first bonding pad on a surface of the first memory chip and forming a second bonding pad on a surface of the second memory chip on the stepped configuration;

forming a first rewiring layer having a first surface and a second surface, wherein the first surface of the first rewiring layer is bonded to the first bonding layer of the bottom step of the stepped configuration;

forming first metal connection pillars, wherein each of the first metal connection pillars has a first end and a second end, wherein said first end is formed on and electrically connected to the one of the first and the second bonding pad;

forming second metal connection pillars, wherein each of the second metal connection pillars has a first end and a second end and is formed outside the memory chip stack;

forming second metal connection pillars, wherein the second metal connection pillars are formed outside the stepped configuration containing the first and second memory chips, and wherein each of the second metal connection pillars has a first end and a second end, each of the first ends of the second metal connection pillars is bonded to the first surface of the first rewiring layer;

forming a first encapsulating layer, wherein the first encapsulating layer encapsulates the first and the second memory chips in the stepped configuration the first metal connection pillars, and the second metal connection pillars, wherein the second end of each of the first metal connection pillars and the second end of each of the second metal connection pillars are exposed from the first encapsulating layer, forming a second rewiring layer having a first surface and a second surface, wherein the second surface of the second rewiring layer is formed over a top side of the stepped configuration, and the second surface of the second rewiring layer is connected to a second end of each of the first metal connection pillars and the second end of each of the second metal connection pillars; and forming metal bumps on the first surface of the second rewiring layer;

forming at least one peripheral circuit chip in two dimensions, wherein the at least one peripheral circuit chip is electrically connected with the second surface of the first rewiring layer; and encapsulating the at least one peripheral circuit chip with a second encapsulating layer.

9. The method of packaging the three-dimensional fan-out memory package structure according to claim 8, wherein before encapsulating the at least one peripheral circuit chip using the second encapsulating layer, the method further comprises a step of forming a bottom filler layer between a back side of the at least one peripheral circuit chip and the second surface of the first rewiring layer.

* * * * *